United States Patent
Yura et al.

(10) Patent No.: US 10,833,628 B2
(45) Date of Patent: Nov. 10, 2020

(54) FAILURE DIAGNOSTIC METHOD AND FAILURE DIAGNOSTIC DEVICE OF SOLAR CELL STRING

(71) Applicant: Mitsubishi Electric Corporation, Chiyoda-ku (JP)

(72) Inventors: Shinsuke Yura, Tokyo (JP); Mutsumi Tsuda, Tokyo (JP); Hidetada Tokioka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 2 days.

(21) Appl. No.: 16/097,005

(22) PCT Filed: Apr. 4, 2017

(86) PCT No.: PCT/JP2017/014009
§ 371 (c)(1),
(2) Date: Oct. 26, 2018

(87) PCT Pub. No.: WO2017/212757
PCT Pub. Date: Dec. 14, 2017

(65) Prior Publication Data
US 2019/0140590 A1    May 9, 2019

(30) Foreign Application Priority Data
Jun. 9, 2016    (JP) .................................. 2016-115384

(51) Int. Cl.
*H02S 50/00*    (2014.01)
*H02S 40/36*    (2014.01)

(52) U.S. Cl.
CPC .............. *H02S 50/00* (2013.01); *H02S 40/36* (2014.12)

(58) Field of Classification Search
None
See application file for complete search history.

(56) References Cited

U.S. PATENT DOCUMENTS

2017/0033735 A1    2/2017   Tsuda et al.
2017/0310276 A1*   10/2017  Takeuchi ................ H02S 50/10

FOREIGN PATENT DOCUMENTS

JP    2008-91828 A    4/2008
WO   WO 2015/163329 A1    10/2015

OTHER PUBLICATIONS

Chinese Office Action dated Dec. 6, 2019 in Chinese Patent Application No. 201780033197.0 (with English translation), 15 pages.

(Continued)

*Primary Examiner* — Jas A Sanghera
(74) *Attorney, Agent, or Firm* — Xsensus LLP

(57) ABSTRACT

A technique that ensures proper failure diagnosis of a solar cell string. A failure diagnostic method and a failure diagnostic device of the solar cell string include an impedance measure, an analyzer, and a determination processor. The analyzer obtains the inductance of the solar cell string based on a relational expression containing an impedance, an inductance, and a frequency in a predetermined equivalent circuit of the solar cell string, and the frequency characteristic of the first impedance measured by the impedance measure. The determination processor conducts failure diagnose for the solar cell string based on the inductance obtained by the analyzer.

7 Claims, 12 Drawing Sheets

(56) References Cited

OTHER PUBLICATIONS

International Search Report dated Jun. 13, 2017 in PCT/JP2017/014009 filed Apr. 4, 2017.
Combined Chinese Office Action and Search Report dated Jul. 3, 2019 in Patent Application No. 201780033197.0 (with partial English translation and English translation of categories of cited documents), 18 pages.
Combined Chinese Office Action and Search Report dated Mar. 13, 2020, in Patent Application No. 201780033197.0 (with English translation), 18 pages.
Office Action dated Jul. 1, 2020 in Chinese Patent Application No. 201780033197.0, 15 pages.

* cited by examiner

FAILURE DIAGNOSTIC METHOD AND FAILURE DIAGNOSTIC DEVICE OF SOLAR CELL STRING

TECHNICAL FIELD

The present invention relates to a failure diagnostic method of a solar cell string including a plurality of solar cell modules and a failure diagnostic device of the solar cell string.

BACKGROUND ART

Photovoltaic power generation is greatly expected as an alternative energy source for thermal power generation and nuclear power generation and in recent years, the production volume of the solar cell has been rapidly increased. Solar cells include a crystalline solar cell in which a photovoltaic cell is formed using a single crystal substrate or a polycrystalline silicon substrate, or a thin film solar cell in which a photovoltaic cell is formed by deposition of a silicon thin film on a glass substrate. The installation unit of the solar cell in the photovoltaic power generation system is based on solar cell modules. A plurality of the above-described photovoltaic cells are formed into a panel, by connecting the photovoltaic cells in, either series or parallel, depending on a purpose, and a frame being an outer frame and a terminal box are provided thereto, the solar cell module is thus configured.

Further, regarding the photovoltaic cell, the plurality of solar cell modules are connected in series and the frames of the solar cell modules are fixed on the shared metal base, thereby the solar cell string is configured. In the following description, the solar cell module and the solar cell string are respectively referred to as "module" and "string".

The photovoltaic power generation system is configured by combining the solar cell string, a transmission cable, a junction box, and a power conditioner. Such a system is employed not only for power generation for home use in general, but a system in which the solar cell strings are arrange in an array is employed also in large scale solar power plants with power generation of 1 MW and over.

In the above described solar cell module, nothing is mechanically operated, its life is generally considered to last for 20 years and over. However, cases have been reported in reality that malfunction occurs due to various causes only several years after the start of operation. The known causes for malfunction are as follows: increase of resistance caused by degradation of a power generation layer in the photovoltaic cell or corrosion of electrodes, declining light transmittance of a sealing material filled to protect the photovoltaic cell such that the circumference of the photovoltaic cell is surrounded therewith, insulation deterioration, increase of wiring resistance in the solar cell module, and defective grounding of the metal base on which the solar cell module is fixed. Such malfunction reduces output of the solar cell module and may lead to a defective operation.

A diagnostic technique to detect, as required, the presence of failure in the solar cell module and string has been required in order to enhance credibility of the photovoltaic power generation system, and to further promotion thereof. At present, the general method is to monitor the power generation by measuring a current and a voltage generated in the whole string to confirm a failure state of the solar cell string. However, the power generation of the solar cell is greatly affected by external factors such as intensity of solar radiation and meteorological conditions at the time of measurement, therefore, determination of if the string properly operates only by monitoring the power generation of the solar cell string is difficult. Further, the above described power generation monitoring of the string fails to specify any failed modules and disconnection parts in the string even if some abnormalities occur in power generation of the string. Consequently, the only means to find the failed parts is to remove the panels of the solar cell modules one by one which is time-consuming and requires labor.

In view of such a state, a failure diagnostic method, such as in Patent Document 1 of recent years, in which the failed modules and the disconnection part are specified by measuring earth capacity (Cg) of the solar cell string is newly proposed. Specifically, an output cable of a negative terminal of the solar cell string is opened and an output cable of a positive terminal is connected to a measuring terminal of a positive terminal of an LCR meter. Subsequently, a measuring terminal of a negative terminal of the LCR meter is directly grounded on the earth, or, the measuring terminal is connected to the metal base on which the solar cell string is fixed. Measurement of earth capacity of the solar cell string is conducted in the connection state with a low frequency ranging between about 100 Hz and 1 kHz.

In a light state with presence of solar light, the solar cell module is in a power-generation state, therefore, a pn junction is ON, that is, in a short-circuit state, the solar cell string becomes equivalent to a circuit in which series resistances ($R_s$) of respective modules are serially connected. In the light state as described, the earth capacity between the solar cell string and the earth can be measured with the use of the LCR meter. A value of the earth capacity proportionately increases to the number of modules. Accordingly, when a disconnection has occurred in the solar cell string, the disconnection part is specified by calculating, from the value of the earth capacity, the number of modules present from the LCR meter to the disconnection part.

PRIOR ART DOCUMENTS

Patent Documents

[Patent Document 1] Japanese Patent Application Laid-Open No. 2008-091828

SUMMARY

Problem to be Solved by the Invention

In the technique of Patent Document 1, the frequency of a measurement signal used by the above described LCR meter in the measurement of the earth capacity (CO of the solar cell string ranges between about 100 Hz and 1 kHz which is low. In such a low range of frequency, impedance determined by frequency and junction capacitance of the solar cell module is relatively large, therefore, there is a difficulty in transmitting the measurement signal over multiple modules, accordingly, a problem is raised that the failure diagnosis can be conducted only with a small number of module units. Moreover, in the technique of Patent Document 1, the solar cell string to be diagnosed is necessary to be separated from the power generating system during the daytime in which the junction is ON to measure the earth capacity, a problem is raised that the power generation of the whole photovoltaic power generation system declines.

Further, the earth capacity of the solar cell string is a static capacitance between a wiring and a metal frame of the solar cell module and a value of the earth capacity is proportional to a dielectric constant of a high-polymer material such as Ethylene-Vinyl Acetate (EVA) that is sealed between the wiring and the metal frame. It is known that the dielectric constant of a sealant such as the EVA gradually changed as a result of deterioration of material characteristics caused by some change in its molecular structure due to a long time outdoor use in which the sealant is exposed to ultraviolet ray or is penetrated by moisture from an end of the module. For example, a research on change with time of the earth capacity of a thin-film silicon solar cell module shows that the value of the earth capacity after exposure for 170 days outdoors was decreased by about 15% of the initial value. Accordingly, the earth capacity changes with time as the dielectric constant of the sealant changes with time, therefore, in the technique of Patent Document 1, a problem that the solar cell string is erroneously determined to be failed is raised despite the solar cell string is actually not failed.

The present invention has been made in view of the aforementioned issues, and it is an object of the present invention to provide a technique that ensures proper failure diagnosis of the solar cell string.

Means to Solve the Problem

The present invention is intended for a failure diagnostic method of a solar cell string includes a plurality of solar cell modules each having a photovoltaic power generator and an electro-conductive frame, a plurality of photovoltaic power generators of the plurality of solar cell modules being electrically connected in series by an output cable, a plurality of frames of the plurality of solar cell modules being electrically connected in common. A first aspect of the present invention, the method includes the following steps (a) to (c). The step (a) is to measure frequency characteristic of a first impedance between one end of the output cable and the plurality of frames electrically connected in common by an impedance measure. The step (b) is to obtain an inductance of the solar cell string based on a relational expression containing an impedance, an inductance, and a frequency in a predetermined equivalent circuit of the solar cell string and the frequency characteristic of the first impedance measured in the step (a). The step (c) is to conduct failure diagnosis for the solar cell string based on the inductance obtained in the step (b).

The present invention is intended for a failure diagnostic device of solar cell a includes a plurality of solar cell modules each having a photovoltaic power generator and an electro-conductive frame, a plurality of photovoltaic power generators of the plurality of solar cell modules being electrically connected in series by an output cable, a plurality of frames of the plurality of solar cell modules being electrically connected in common. A second aspect of the present invention, the failure diagnostic device includes n impedance measure configured to measure frequency characteristic of a first impedance between one end of the output cable and the plurality of frames electrically connected in common, an analyzer configured to obtain an inductance of the solar cell string based on a relational expression containing an impedance, an inductance, and a frequency in a predetermined equivalent circuit of the solar cell string and the frequency characteristic of the first impedance measured by the impedance measure, and a determination processor configured to conduct failure diagnosis for the solar cell string based on the inductance obtained by the analyzer.

Effects of the Invention

An inductance of the solar cell string is obtained and diagnosis of failure of the solar cell string is conducted based on the obtained inductance. According to the configuration, a failure of the solar cell string can be properly diagnosed.

These and other objects, features, aspects and advantages of the present invention will become more apparent from the following detailed description of the present invention when taken in conjunction with the accompanying drawings.

DESCRIPTION OF EMBODIMENT(S)

First Embodiment

Figure 1:
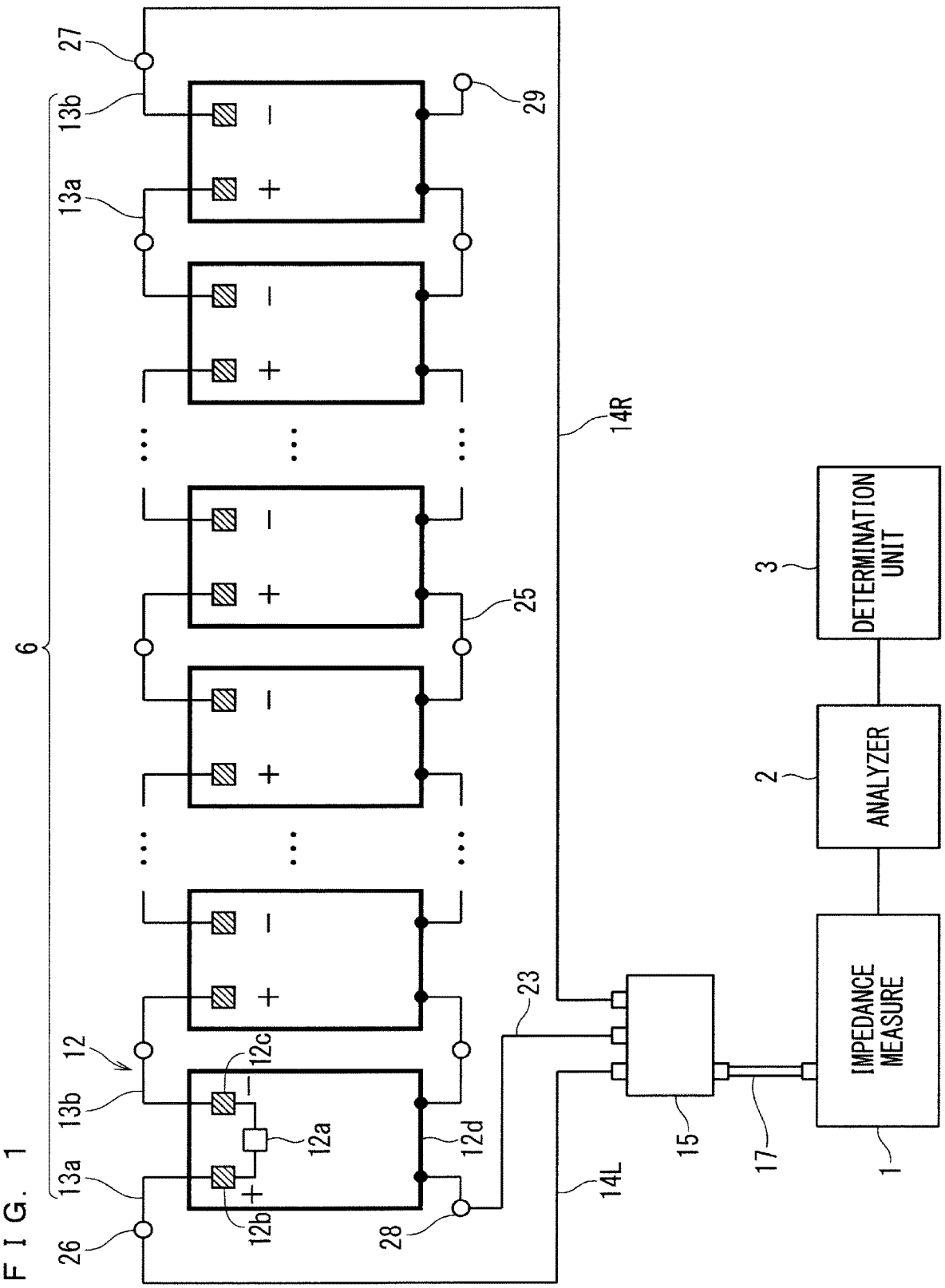
FIG. 1 A schematic configuration diagram illustrating a solar cell string and a failure diagnostic device according to a first embodiment.

FIG. 1 is a schematic configuration diagram illustrating a solar cell string and a failure diagnostic device for diagnosis of the solar cell string according to a first embodiment of the present invention. The photovoltaic power generation system is configured by connecting the following solar cell strings 6 in parallel.

<Solar cell string>

The solar cell string 6 includes a plurality of solar cell modules 12. Each of the plurality of solar cell modules 12 includes a photovoltaic power generator 12a, a terminal box 12b, a terminal box 12c, and a frame 12d.

The photovoltaic power generator 12a generates power in accordance with received solar light. As the photovoltaic power generator 12a, photovoltaic cells connected either in series or parallel are applied. The photovoltaic cell may include the photovoltaic cell formed of a semiconductor using a pn junction, for example, as the photovoltaic cell, a crystalline photovoltaic cell that is formed of a single crystal silicon substrate or a thin film photovoltaic cell that is formed of a glass substrate and a silicon thin film are applied.

The terminal box 12b of the positive electrode and the terminal box 12c of the negative electrode are arranged on a back surface side of the solar cell module 12 and extract generated power from the photovoltaic power generator 12a. The terminal box 12b of the positive electrode is electrically connected to an output cable 13a of a positive electrode and the terminal box 12c of the negative electrode is electrically connected to an output cable 13b of a negative electrode. Accordingly, the generated power extracted by the terminal boxes 12b and 12c is output to the outside of the solar cell module 12 by the output cables 13a and 13b.

The frame 12d is an electro-conductive frame such as a metal frame, and is arranged on the outer circumference of the solar cell module 12. The frame 12d is, generally, electrically insulated from the photovoltaic power generator 12a, the terminal boxes 12b and 12c and the output cables 13a and 13b.

In the solar cell string 6, a plurality of photovoltaic power generators 12a of a plurality of solar cell modules 12 are electrically connected in series by the output cables 13a and 13b. In such series connection, in the present first embodiment, of adjacent given two solar cell modules 12, the output cable 13b of the negative electrode of the one solar cell module 12 and the output cable 13a of the positive electrode of the other solar cell module 12 are connected each other. Consequently, the output cable 13a of the solar cell module 12, that locates at one end and the output cable 13b of the solar cell module 12, that locates at the other end are the cables that are not used in the series connection. Hereunder, the output cable 13a and the output cable 13b that are not used in the series connection may be respectively referred to as an end side output cable 13a and an end side output cable 13b in the description.

In the solar cell string 6, a plurality of frames 12d of a plurality of solar cell modules 12 are electrically connected in common. In such common connection, in the present first embodiment, of adjacent given two solar cell modules 12, the frame 12d of the one solar cell module 12 and the frame 12d of the other solar cell module 12 are electrically connected by a ground wire 25 which is wiring. Additionally, connection between the frames 12d is not limited to the series connection, when the solar cell module 12 is fixed on the metal base and installed outdoors, the frames 12d may be electrically connected by the base, instead of the ground wire 25.

<Failure diagnostic device>

The failure diagnostic device according to the present first embodiment includes an impedance measure 1, an analyzer 2, and a determination unit 3. The analyzer 2 and the determination unit 3 are materialized as functions of Central Processing Unit (CPU) by executing programs stored in a storage unit (not shown) of a computer, such as semiconductor memory, by the CPU of the computer (not shown), for example. Further, not only the analyzer 2 and the determination unit 3, but control of impedance measure 1 and control such as storage and transfer of measurement data may be materialized as functions of CPU, moreover, the series of operations from measurement to output of diagnostic results may also be automatically performed.

Next, before the description on components of the failure diagnostic device is made, a configuration provided between the solar cell string 6 and the failure diagnostic device is described.

The impedance measure 1 is connected to coupling cables 14L and 14R and a ground wire 23 via a coaxial cable 17 and the junction box 15 in sequence. A connector 26 and a connector 27 each provided on the corresponding end side output cables 13a and 13b are configured to be connected to the coupling cables 14L and 14R and disconnected therefrom. Similarly, a connector 28 and a connector 29 each provided on the corresponding ground wires 25 of the solar cell string 6 are configured to be connected to the ground wire 23 and disconnected therefrom.

Figure 2:
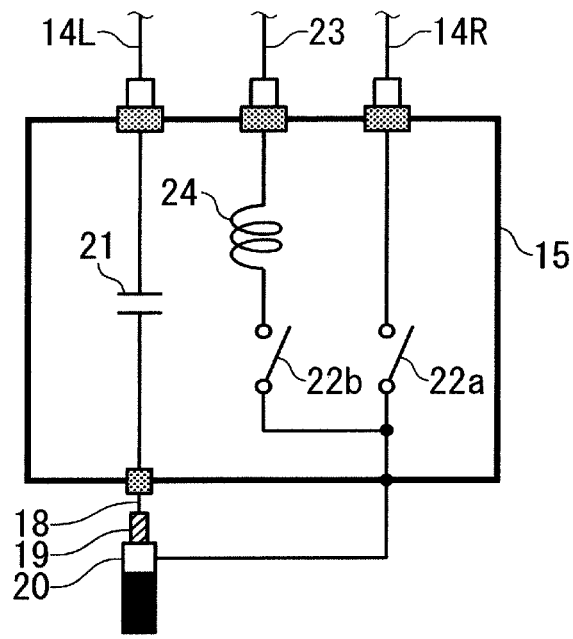
FIG. 2 A schematic configuration diagram illustrating the inside of a junction box according to the first embodiment.

FIG. 2 is a schematic configuration diagram illustrating the inside of a junction box 15 according to the present first embodiment.

The junction box 15 is connected to the coupling cables 14L and 14R, the ground wire 23, and the coaxial cable 17.

The coaxial cable 17 includes a central conductor 18, a dielectric 19 having insulation, and an external conductor 20. The central conductor 18 is connected to the measuring terminal of the impedance measure 1 in FIG. 1 and the external conductor 20 is connected to a ground terminal (GND) of the impedance measure 1. And the central conductor 18 and the external conductor 20 are electrically insulated by the dielectric 19.

In the junction box 15, a blocking capacitor 21 for preventing a DC connected between the coupling cable 14L and the central conductor 18, a switch 22a connected between the coupling cable 14R and the external conductor 20, and an inductor 24 for adjusting a resonance point and a switch 22b connected between the ground wire 23 and the external conductor 20 are provided.

Here, the inductor 24 for adjusting a resonance point and the switch 22b are directly connected thereby forming a resonance point adjustment circuit. A value of the inductor 24 for adjusting a resonance point may be selected such that a resonance frequency of the first impedance to be measured falls within a measurement frequency range of the impedance measure 1. Incidentally, the positional relationship between the inductor 24 for adjusting a resonance point and the switch 22b may be a reversed positional relationship of that of in FIG. 2.

Further, the switches 22a and 22b may include a manually operated toggle switch, a diode switch driven by a gate signal, and a switching device such as Metal-Oxide-Semiconductor Field-Effect Transistor (MOSFET).

In the configuration described above, when the connector 26 in FIG. 1 is connected to the coupling cable 14L, the end side output cable 13a is electrically connected to the impedance measure 1 via the coupling cable 14L, the blocking capacitor 21 for preventing a DC in the junction box 15, and the central conductor 18 of the coax cable 17.

When the connector 27 in FIG. 1 is connected to the coupling cable 14R and the switch 22a in the junction box 15 is ON, the end side output cable 13b is electrically connected to the ground terminal of impedance measure 1 via the coupling cable 14R, the switch 22a in the junction box 15, and the external conductor 20 of the coax cable 17.

Meanwhile, the switch 22a in the junction box 15 is OFF, the end side output cable 13b and the ground terminal of the impedance measure 1 are disconnected and the end side output cable 13b is electrically insulated from the ground terminal.

When one of the connectors 28 and 29 in FIG. 1 is connected to the ground wire 23 and the switch 22b in the junction box 15 is ON, the frame 12d of the solar cell string 6 is electrically connected to the ground terminal of the impedance measure 1 via the ground wire 25, the ground wire 23, the inductor 24 for adjustment of a resonance point in the junction box 15, the switch 22b in the junction box 15, and the external conductor 20 of the coax cable 17. Meanwhile, the switch 22b in the junction box 15 is OFF, the frame 12d and the ground terminal of the impedance measure 1 are disconnected and the frame 12d is electrically insulated from the ground terminal.

Next, the impedance measure 1, the analyzer 2, and the determination unit 3 included in the failure diagnostic device are described.

The impedance measure 1 measures frequency characteristic of the first impedance between one of the end side output cables 13a and 13b which is the corresponding one end of output cables 13a and 13b and the plurality of frames 12d electrically connected in common, that is, frequency dependency of the first impedance.

Here, determination of the resonance point can be formed by practically sweeping the measurement frequency, therefore, in the present first embodiment, the impedance measure 1 measures the frequency characteristic of the first impedance by using the measurement signal having high frequency. "Practically sweeping the measurement frequency" refers to, for example, operation of continuously sweeping frequency, or, operation of discretely sweeping at regular intervals. As an impedance measure 1, a network analyzer, an impedance analyzer, a combination analyzer, and so forth may be applied, or a combination among a frequency variable high frequency transmitter, a current sensor, a voltage sensor, an AD converter, and an arithmetic unit may be applied.

In the example in FIG. 1, a state where a casing of the impedance measure 1 is grounded by a three-pronged plug or a ground wire is intended, however, a casing of the impedance measure 1 is not necessarily grounded, and may electrically float. Further, the ground wire 25 of the solar cell string 6 in FIG. 1 is grounded, when the switch 22b is ON, by the ground wire 23 via the casing of the impedance measure 1, however, separate grounding using another ground wire may also be allowed. The grounding condition of the casing of the impedance measure 1 and the solar cell string 6 does not practically affect the diagnostic result of the solar cell module according to the present first embodiment.

The measurement of the frequency characteristic of the first impedance by the impedance measure 1 is conducted during the time when the solar cell module 12 is in a dark state, such as nighttime hours when the photovoltaic power generator 12a of the solar cell module 12 does not generate power, for example. Here, when the light incidentally enters on a light receiving surface of the solar cell module 12, in the middle of the measurement of the frequency characteristic of the first impedance, the photovoltaic power generator 12a in the solar cell module 12 generates power, possibly causing generation of a relatively large direct voltage ranging from, for example, tens to hundreds V between the terminal box 12b and the terminal box 12c.

To protect the impedance measure 1 from the overvoltage, in the present first embodiment, the blocking capacitor 21 for preventing a DC is provided between the solar cell string 6 and the measuring terminal of the impedance measure 1. Meanwhile, the frequency of the measurement signal supplied from the measuring terminal of the impedance measure 1 to the solar cell string 6 is relatively high as described above, the measurement signal readily passes the blocking capacitor 21 to be transmitted to the solar cell string 6.

Next, of the components of the failure diagnostic device, the analyzer 2 and the determination unit 3 are described. However, the details of the analyzer 2 and the determination unit 3 are described later, and the brief description thereof is made hereunder. The analyzer 2 obtains the inductance of the solar cell string 6 based on a relational expression containing an impedance, an inductance, and a frequency in the predetermined equivalent circuit of the solar cell string 6, and the frequency characteristic of the first impedance measured by the impedance measure 1. The determination unit 3 conducts failure diagnosis for the solar cell string 6 based on the inductance obtained by the analyzer 2.

<Failure Diagnosis>

Figure 3:
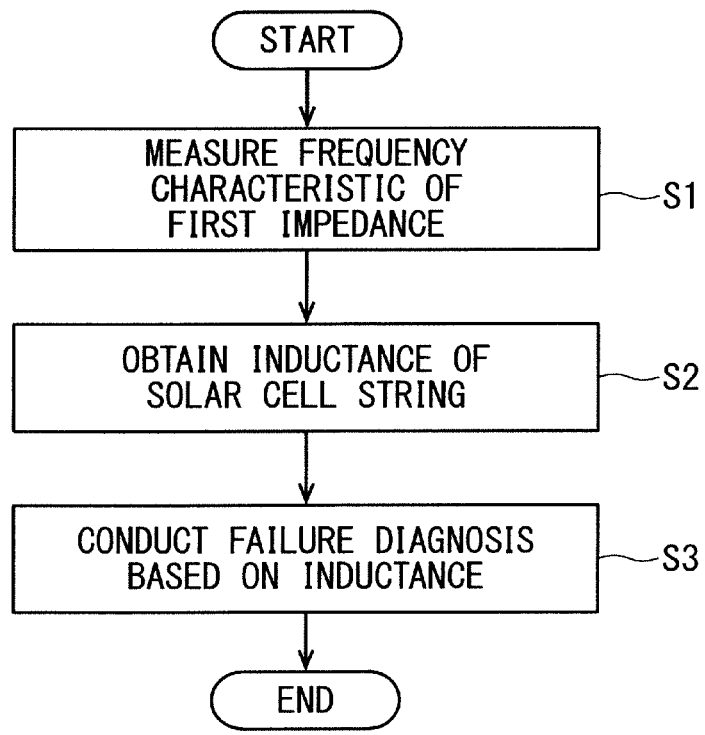
FIG. 3 A flowchart illustrating an operation of a failure diagnostic device according to the first embodiment.

FIG. 3 is a flowchart illustrating an operation of a failure diagnostic device according to the present first embodiment to conduct failure diagnosis for the solar cell string 6. The solar cell string 6 to be diagnosed is assumed to be configured, similarly to the general solar cell string, such that the same specification solar cell modules are periodically arranged. In addition, the step S1 is assumed to perform during the time, such as nighttime, when the stop of the photovoltaic power generation system causes no trouble.

First, as a previous step of the step S1, an operator and so forth operates the connectors 26 and 27 to separate, from the photovoltaic power generation system, the end side output cables 13a and 13b of the solar cell string 6 to be diagnosed and then, connects the end side output cables 13a and 13b to the coupling cables 14L and 14R of FIG. 1, respectively. However, the output cable 13b may be left open without being connected to the coupling cable 14R of FIG. 1. Further, the operator and so forth operates the connectors 28 and 29 to separate, from the photovoltaic power generation system, the ground wire 25 of the solar cell string 6 to be diagnosed and then, connects the ground wire 25 to the ground wire 23 of FIG. 1. Here, the connector 28 corresponding to the output cable 13a is connected to the ground wire 23 and the connector 29 corresponding to the output cable 13b is left open.

In the step S1, the impedance measure 1 measures frequency characteristic of the first impedance between the end side output cable 13a of the solar cell string 6 and the plurality of frames 12d electrically connected in common. That is, the impedance measure 1 measures the frequency characteristic of the impedance beyond the junction box 15.

In the present first embodiment, the measurement is conducted by, so-called one-port reflection method employing a network analyzer as the impedance measure 1. Specifically, a feeble sine wave voltage of 5 V or less, for example, is input, as the measurement signal, from the impedance measure 1 being the network analyzer to the solar cell string 6 and a reflectance r is measured. Here, a first impedance Z is represented by the following expression (1) using the impedance Z0 of the network analyzer and the reflectance r.

[Expression 1]

$$Z = \frac{1+r}{1-r} Z_0 \qquad (1)$$

The impedance Z0 is known, therefore, the impedance measure 1 measures the first impedance Z by applying the reflectance r into the above expression (1). The impedance measure 1 appropriately changes the frequency of the measurement signal within the range from 100 to 2 MHz, thereby conducting the measurement of the first impedance Z. This is how the impedance measure 1 measures the frequency characteristic of the first impedance.

In the above-described measuring system, the one-port reflection method is employed, however, the method is not limited thereto. Further, in the above-described measuring system, the network analyzer is configured to measure the impedance via the blocking capacitor 21 and so forth. Therefore, to be precise, a combined impedance combined with the first impedance, the impedances of the blocking capacitor 21 and so forth, is to be measured. Accordingly, a calibrator is preferably connected to a part from the connectors 26 and 27 to the impedance measure 1 side and preferably calibrates in response to the impedance to be measured in that case.

In the step S2, the analyzer 2 obtains the inductance of the solar cell string 6 based on a relational expression containing an impedance, an inductance, and a frequency in the predetermined equivalent circuit of the solar cell string 6, and the frequency characteristic of the first impedance measured by the impedance measure 1.

Figure 4:
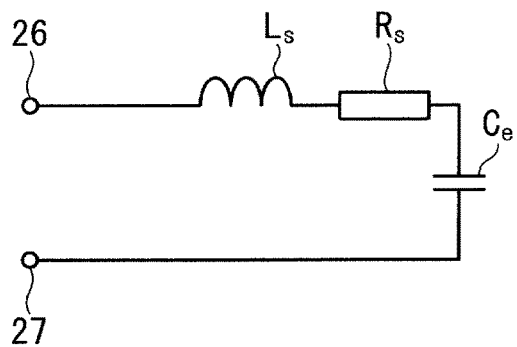
FIG. 4 A circuit diagram illustrating an equivalent circuit model of the solar cell string of the first embodiment.

FIG. 4 is a circuit diagram illustrating an equivalent circuit model of the solar cell string 6 of FIG. 1. Specifically, in FIG. 4, an equivalent circuit in which the solar cell string 6 in which the plurality of solar cell modules 12 are connected is simplified as one virtual solar cell module equivalent thereto is illustrated. In the description on the equivalent circuit, the inductor is also referred to as inductance, and the capacitor is also referred to as capacity or capacitance.

In the equivalent circuit in FIG. 4, the inductance $L_s$, a resistance $R_s$, and a capacity $C_e$ are connected in series between the connectors 26 and 27. Here, the inductance $L_s$ is an inductance of an electrode wiring, the frame 12*d* of the solar cell module 12, and the ground wire. The resistance $R_s$ is a resistance of the electrode wiring, the frame 12*d* of the solar cell module 12, and the ground wire. The capacity $C_e$ represents stray capacity between an electrode and the frame 12*d* in the solar cell module 12, and is, here, a circuit constant.

Here, the impedance $Z_{st}$ of the equivalent circuit in FIG. 4 is represented by the following expression (2).

[Expression 2]

$$Z_{st} = R_s + j \cdot 2\pi f L_s + \frac{1}{j \cdot 2\pi f C_e} \quad (2)$$

In the expression (2), f represents a frequency and j represents an imaginary The analyzer 2 obtains the inductance of the solar cell string 6 based on a relational expression being the expression (2) containing an impedance, an inductance, and a frequency, and the frequency characteristic of the first impedance measured by the impedance measure 1. Here, the frequency characteristic of the first impedance measured by the impedance measure 1 contain a plural sets of the first impedance and the frequency. The analyzer 2 obtains a resistance, an inductance, and a circuit constant of the solar cell string 6 that are unknown parameters (Rs, Ls, Ce) by assigning the plural sets of the first impedance and the frequency measured by the impedance measure 1 in the impedance Zst and the frequency f of the expression (2)

In the present first embodiment, the number of sets of the first impedance and the frequency measured by the impedance measure 1 is relatively large. In the present first embodiment, the analyzer 2 obtains parameters (Rs, Ls, Ce) by plotting the plural sets of the first impedance and the frequency as a plurality of coordinates in a graph corresponding to the expression (2) and employing the least squares method. Hereunder, the obtained results are described.

Figure 5:
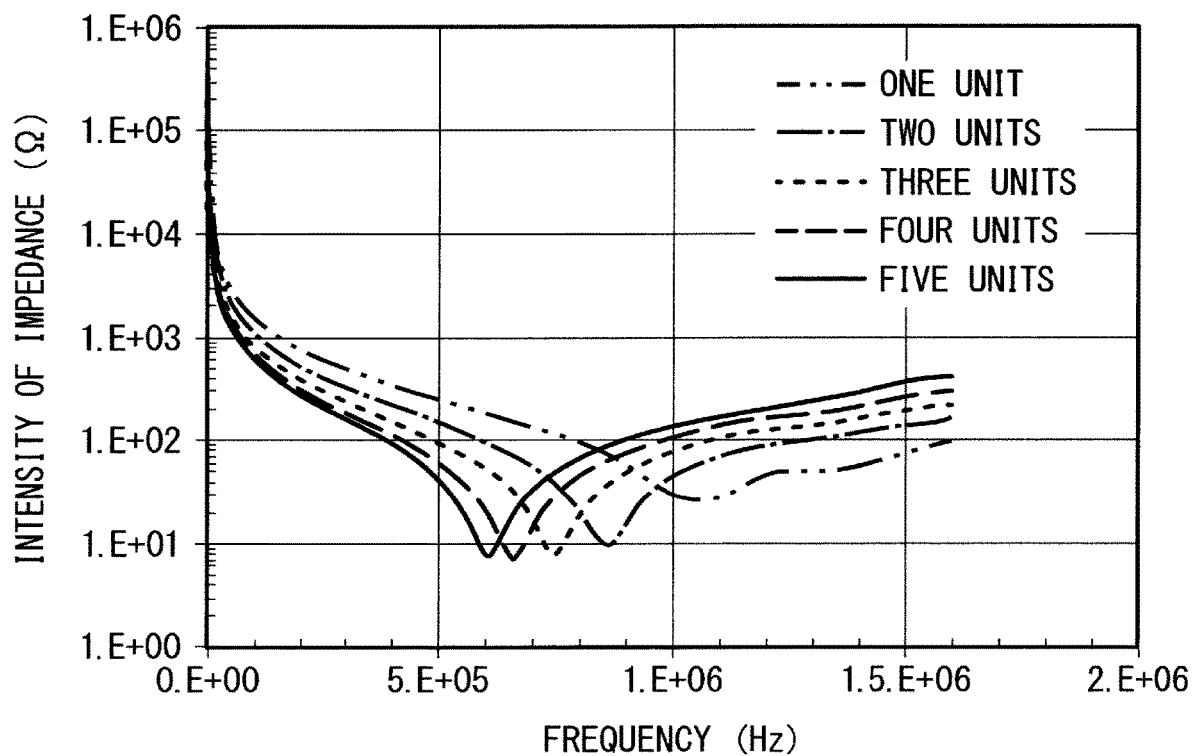
FIG. 5 A graph illustrating an example of frequency characteristics of a first impedance.
Figure 6:
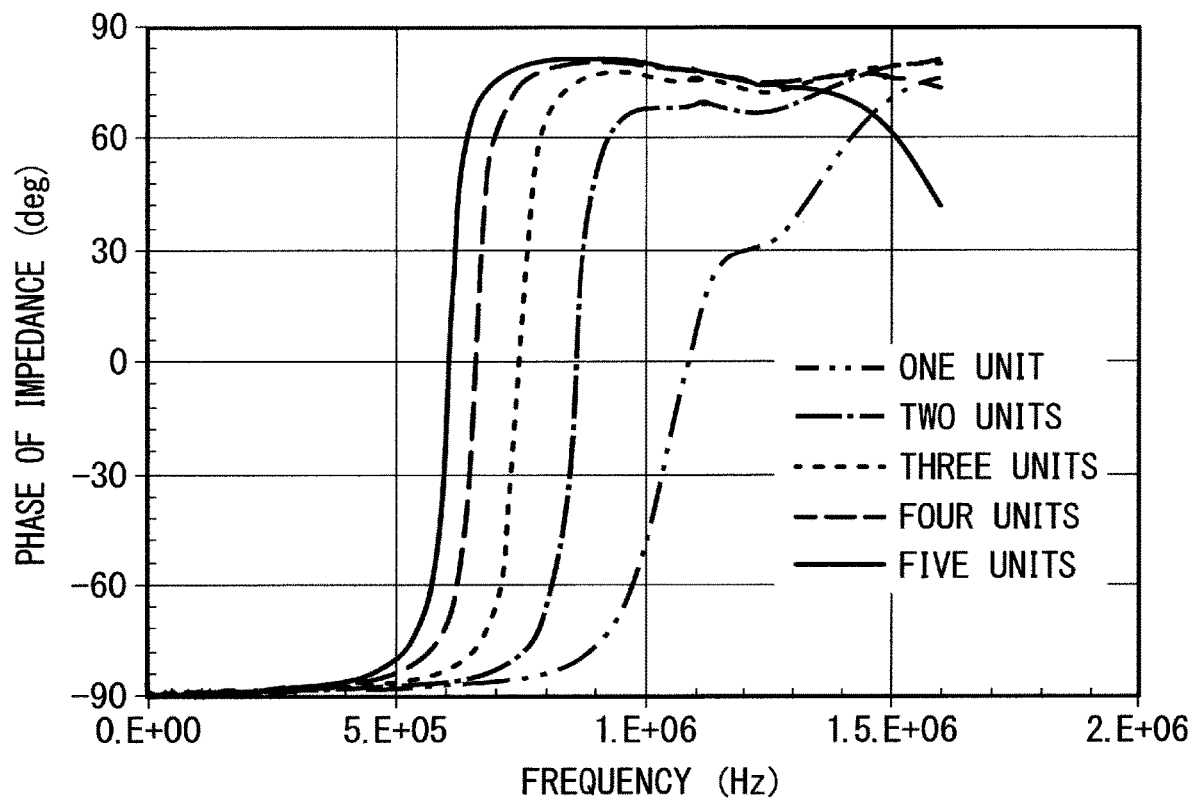
FIG. 6 A graph illustrating an example of frequency characteristics of the first impedance.

FIGS. 5 and 6 are the graphs illustrating an example of frequency characteristics of the first impedance when the number of solar cell modules 12 configuring the solar cell string 6 is one to five. In FIG. 5, the axis of ordinates represents the intensity of the first impedance, in FIG. 6, the axis of ordinates represents the phase of the first impedance, and both of the axes of abscissas in FIGS. 5 and 6, represent the frequency.

Dipped portions indicate the resonance points. It is observed that, as the number of modules that is the number of the solar cell modules 12 increases, the resonance frequency tends to decrease. Data of first impedances and the frequencies, that is appeared as curves as indicated in FIGS. 5 and 6 is assigned in the expression (2), thereby the values of the parameters ($R_s$, $L_s$, $C_e$) are determined. Here, the least squares method using the logarithmic value of the first impedance is employed as a method for obtaining the values of the parameters ($R_s$, $L_s$, $C_e$), however, other methods are applicable as long as, for example, the resonance point is favorably reproduced.

Figure 7:
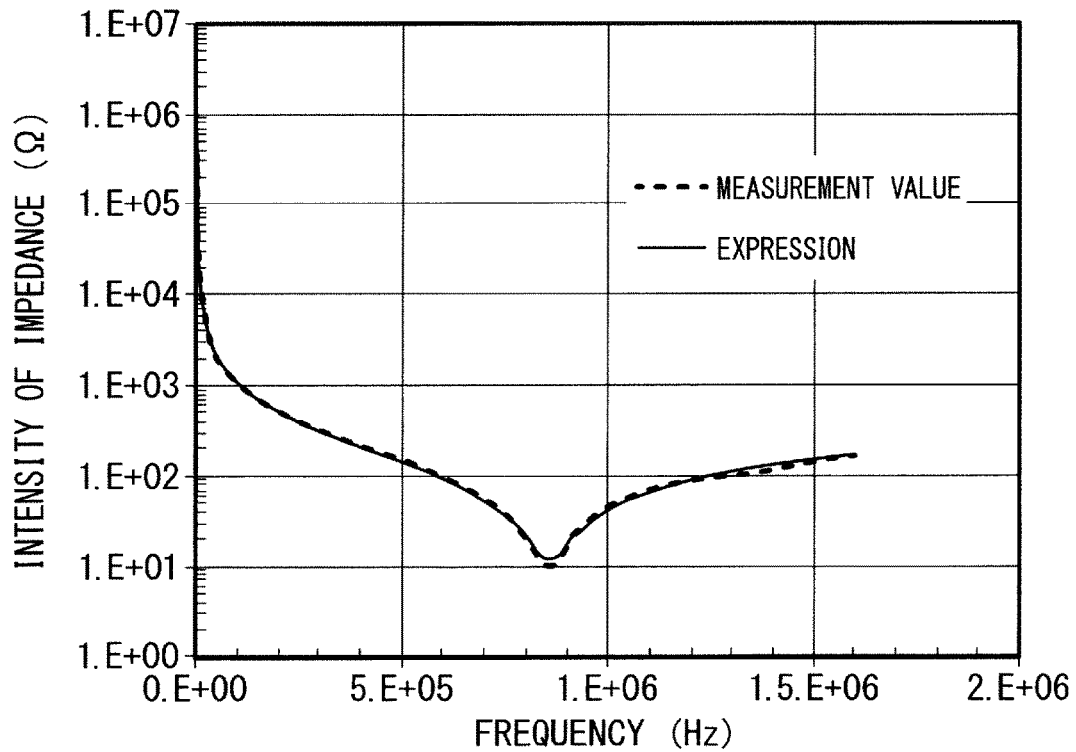
FIG. 7 A graph illustrating an example of frequency characteristics of the first impedance.
Figure 8:
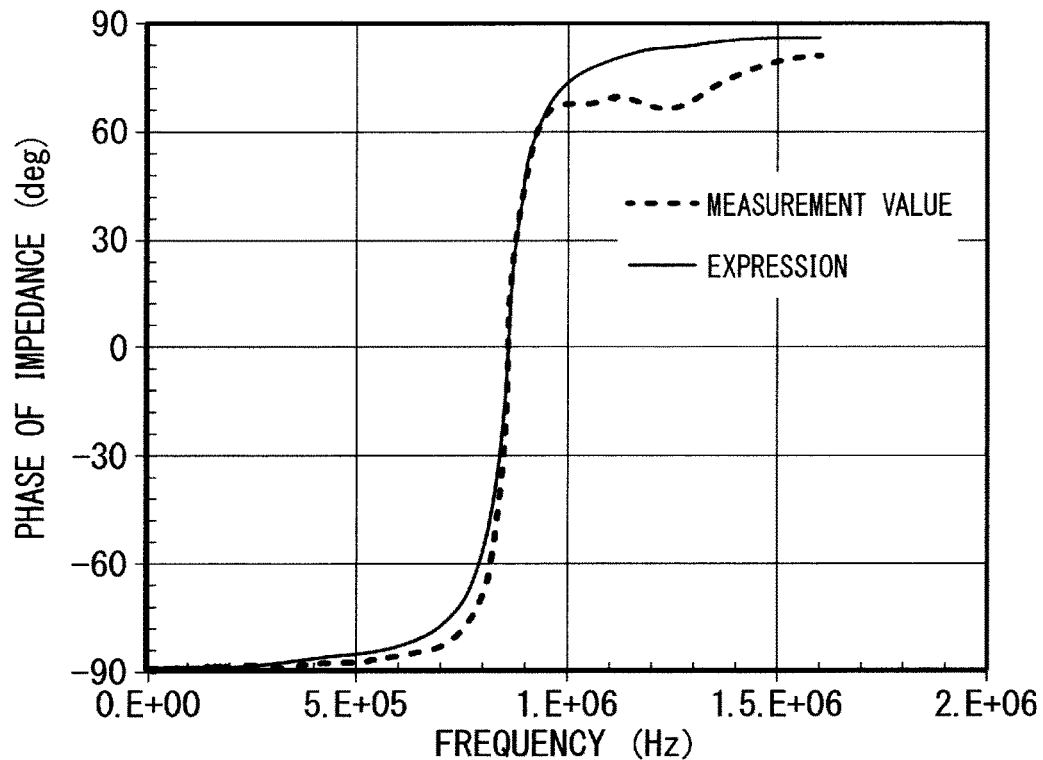
FIG. 8 A graph illustrating an example of frequency characteristics of the first impedance.

FIGS. 7 and 8 illustrate respectively, similarly to FIGS. 5 and 6, when the number of the solar cell modules 12 is two, the graph of measurement values of the first impedance and the graph of the expression (2) in which the measurement values are assigned and the parameters ($R_s$, $L_s$, $C_e$) are determined. In both of FIGS. 7 and 8, broken lines indicate the graphs of the measurement values and solid lines indicate the graphs indicated by the expression (2) in which the parameters are determined. As shown in FIGS. 7 and 8, the graphs indicated by the expression (2) closely matches, at the peak position, with the graphs of the measurement values.

In the step S3 of FIG. 3, the determination unit 3 conducts failure diagnosis for the solar cell string 6 based on the inductance L, obtained by the analyzer 2. In the present first embodiment, the determination unit 3 detects an occurrence of disconnection and the disconnection part of the solar cell string 6 based on the inductance $L_s$ obtained by the analyzer 2 and the inductance associated, in advance, with the number of the solar cell modules 12 in which the photovoltaic power generators 12*a* are electrically connected in series. Incidentally, the number of solar cell modules hereunder is also referred to as "the number of solar cell modules".

Figure 9:
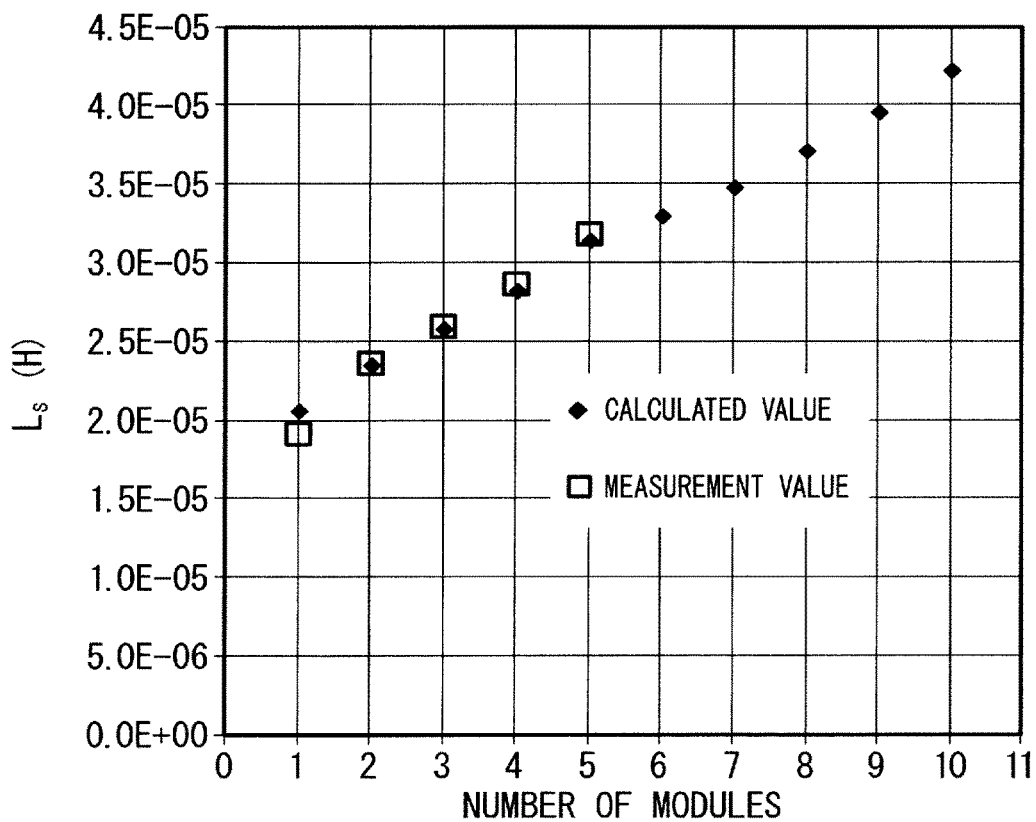
FIG. 9 A graph illustrating a relationship between an inductance of the solar cell string and the number of solar cell modules.

FIG. 9 is a graph illustrating an example of a relationship between an inductance of the solar cell string 6 and the number of solar cell modules of the solar cell string 6. In FIG. 9, the measurement values and calculated values obtained in the step S2 are plotted.

As illustrated in FIG. 9, the inductance increases as the number of the solar cell modules increases. Accordingly, obtaining of the relationship of measurement results between the number of the solar cell modules and the inductance in advance enables to obtain the occurrence of disconnection and the disconnection part of the solar cell string 6.

Specifically, the measurement is conducted, in which the number of solar cell modules that are the same specification to the modules configure the solar cell string and are connected in series is associated with the inductance, in advance, and a graph like FIG. 9 is prepared from the measurement result in advance. And the determination unit 3 obtains, for the solar cell string to be diagnosed, the number of solar cell modules Nr associated with the inductance $L_s$ obtained in the step S2 with the use of the graph. For example, the determination unit 3 obtains the number of solar cell modules associated with the inductance which is the closest to the inductance $L_s$ obtained in the step S2, among the plurality of inductances in the graph like FIG. 9, as the number of solar cell modules Nr.

When the number of solar cell modules Nr is smaller than the number of solar cell modules N configuring the solar cell string to be diagnosed, the determination unit 3 determines that the disconnection has occurred in the solar cell string. In this case, the determination unit 3 determines that the disconnection has occurred between a module that is Nrth and a module that is (Nr+1)th from the positive electrode side, or, in the module that is (Nr+1)th.

The operation of FIG. 3 ends. However, in the above-described example, when the measurement is conducted with the impedance measure 1 being connected to the solar cell string on a positive electrode side as in FIG. 1, the inductance Ls shows no change, even if a disconnection has occurred in the end side output cable 13b of the solar cell string on a negative electrode side. Further, even if a disconnection has occurred in an end solar cell module on the negative electrode side, obtaining a correct determination result of the disconnection may be difficult by taking the measurement error of inductance Ls into consideration.

Therefore, the above-described operation is preferred to be performed in a case, not only where the impedance measure 1 is connected to the positive electrode side, but also where the impedance measure 1 is connected to the negative electrode side. That is, by operating the connectors 26 and 27, the end side output cable 13b of the solar cell string 6 to be diagnosed is connected to the coupling cable 14L of FIG. 1, and the end side output cable 13a is connected to the coupling cable 14R or is left open. In accordance with that, the connector 29 corresponding to the output cable 13b is connected to the ground wire 23 and the connector 28 corresponding to the output cable 13a is left open. With the above described connection state, the operation of FIG. 3 is performed again. In the diagnosis conducted from the negative electrode side, the number of solar cell module N and the inductance Ls have a relationship same as that of described above, therefore, performing this operation enables to determine an occurrence of disconnection in the end side output cable 13b on the negative electrode side and an occurrence of disconnection in an end solar cell module 12 on the negative electrode side.

<Another Example of Obtaining Relationship Between Umber of Solar Cell Module and Inductance>

In FIG. 9, the relationship of the measurement results between the number of the solar cell modules and the inductance is plotted. The frequency characteristic of the first impedance is calculated from the equivalent circuit of the solar cell string 6. The equivalent circuit of the solar cell string is determined based on an equivalent circuit of each of the solar cell modules. Therefore, the relationship of a measurement result between the number of the solar cell modules and the inductance in FIG. 9 may be obtained by calculation when an equivalent circuit of one of the solar cell modules is determined. Hereunder, a method of obtaining the relationship of the measurement results between the number of the solar cell modules and the inductance in FIG. 9 to be used in determination in the step S3 by calculation is described.

Figure 10:
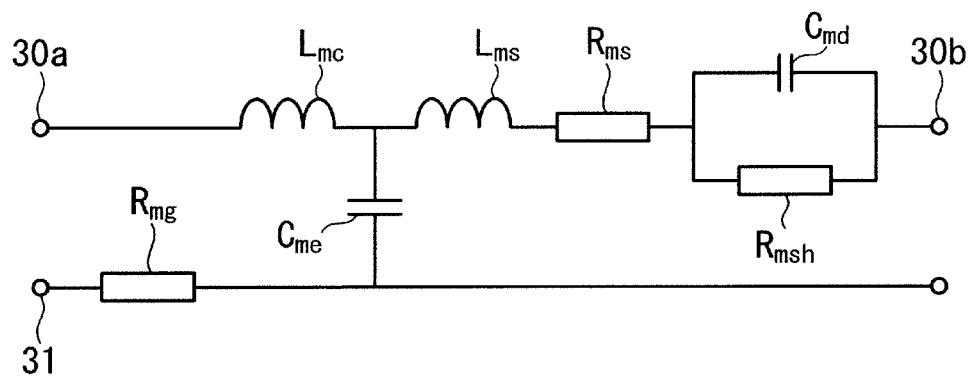
FIG. 10 A circuit diagram illustrating the equivalent circuit model of the solar cell module of the first embodiment.

FIG. 10 is a circuit diagram illustrating the equivalent circuit model of the solar cell module in a dark state. In the equivalent circuit in FIG. 10, between a terminal 30a and a terminal 30b, an inductance $L_{mc}$, an inductance $L_{ms}$, a resistance $R_{ms}$, and a parallel connection body including a capacity $C_{md}$ and a resistance $R_{msh}$ are connected in series. And, between a connecting point between the inductance $L_{mc}$ and the inductance $L_{ms}$ and an installation terminal 31, a resistance $R_{mg}$ and a capacity $C_{me}$ are connected in series.

The terminal 30a corresponds to the output cable 13a of FIG. 1, the terminal 30b corresponds to the output cable 13b of FIG. 1, and the installation terminal 31 corresponds to the ground wire 25 of FIG. 1.

The inductance $L_{mc}$ represents an inductance of an electrode wiring the exterior of the photovoltaic cell, the resistance $R_{mg}$ represents a resistance of a passage through the ground wire to the junction box 15, and the capacity $C_{me}$ represents stray capacity generated between the electrode wiring and the frame 12d by a configuration in which a part of the electrode wiring in the photovoltaic cell passes in the vicinity of the frame 12d.

The inductance $L_{ms}$ represents a series inductance in the module, the $R_{ms}$ represents a series resistance of an electrode in the module and the photovoltaic cell, the capacity $C_{md}$ represents an effective capacity in which junction capacitances of all the photovoltaic cell configuring the module are connected in series, and a resistance $R_{msh}$ represents an effective resistance in which parallel resistances of all the photovoltaic cell configuring the module are connected in series.

Figure 11:
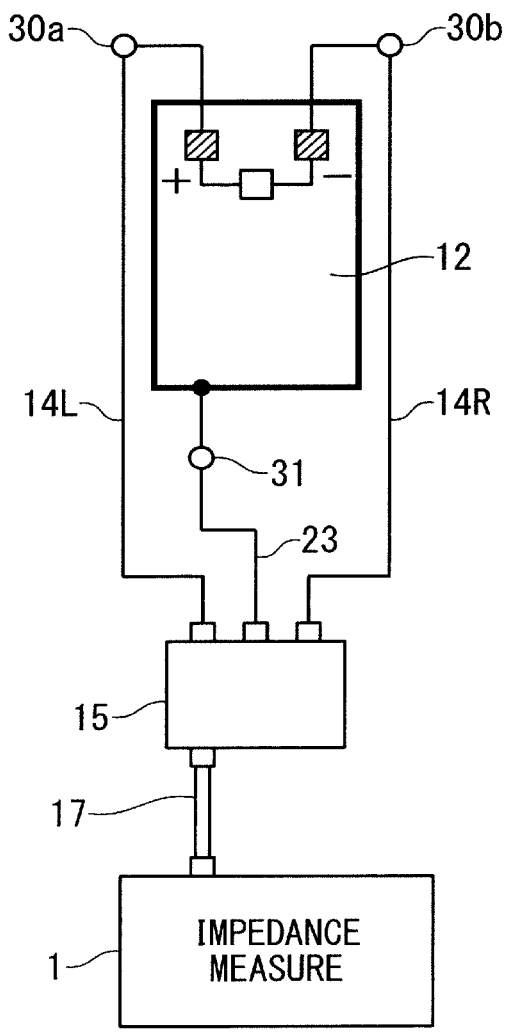
FIG. 11 A schematic configuration diagram illustrating the solar cell module and the failure diagnostic device according to the first embodiment.

As illustrated in FIG. 11, the impedance of the only one of the solar cell modules 12 is measured similarly to the measurement of the solar cell string 6 of FIG. 1. And the measurement value is assigned to the equivalent circuit of FIG. 10, thereby the parameters are determined. The one of the solar cell modules to be measured at this point may preferably have the same specification to the solar cell module included in the solar cell string to be diagnosed, and more preferably, may be one panel of the solar cell module in the solar cell string to be diagnosed.

Hereunder, the method for determining the parameter of the equivalent circuit of FIG. 10 is described.

In a state where, in the junction box 15, the switch 22b is OFF and the switch 22a is ON, the impedance measure 1 measures the frequency characteristic of the impedance between the positive electrode and the negative electrode of the solar cell module 12. For example, as in the same manner as described above, the measurement of the frequency characteristic of the impedance of the solar cell module 12 is conducted by the one-port reflection method employing the network analyzer as the impedance measure 1 The impedance obtained by the measurement is, in the equivalent circuit of FIG. 10, equivalent to the impedance between the terminal 30a and the terminal 30b.

Here, the impedance $Z_{PV1}$ between the terminal 30a and the terminal 30b of the equivalent circuit in FIG. 10 is represented by the following expression (3).

[Expression 3]

$$Z_{PV1} = j \cdot 2\pi f \cdot (L_{mc} + L_{ms}) + R_{ms} + \frac{R_{msh}}{1 + j \cdot 2\pi f R_{msh} C_{md}} \quad (3)$$

For example the analyzer 2 of a failure diagnostic device obtains unknown parameters ($L_{mc}+L_{ms}$, $R_{ms}$, $C_{md}$, $R_{msh}$) by assigning a plural sets of the impedance and a frequency measured by the impedance measure 1 in the impedance $Z_{pvi}$ and the frequency f of the expression (3)

Figure 12:
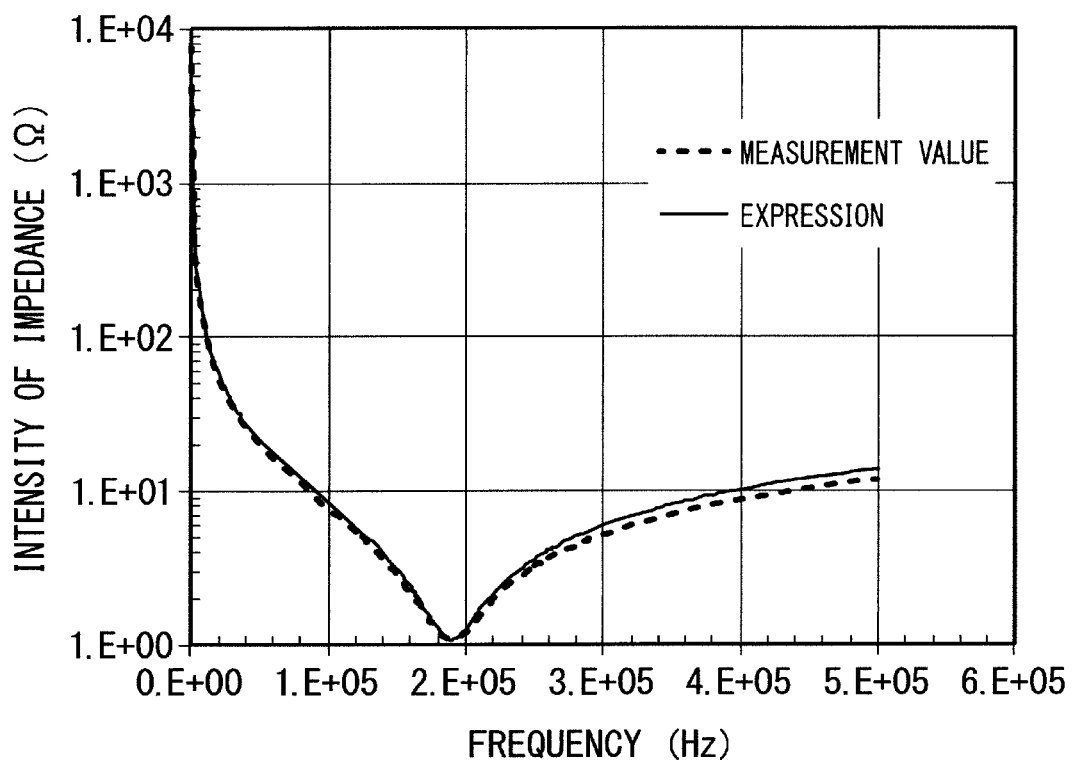
FIG. 12 A graph illustrating an example of frequency characteristics of an impedance.
Figure 13:
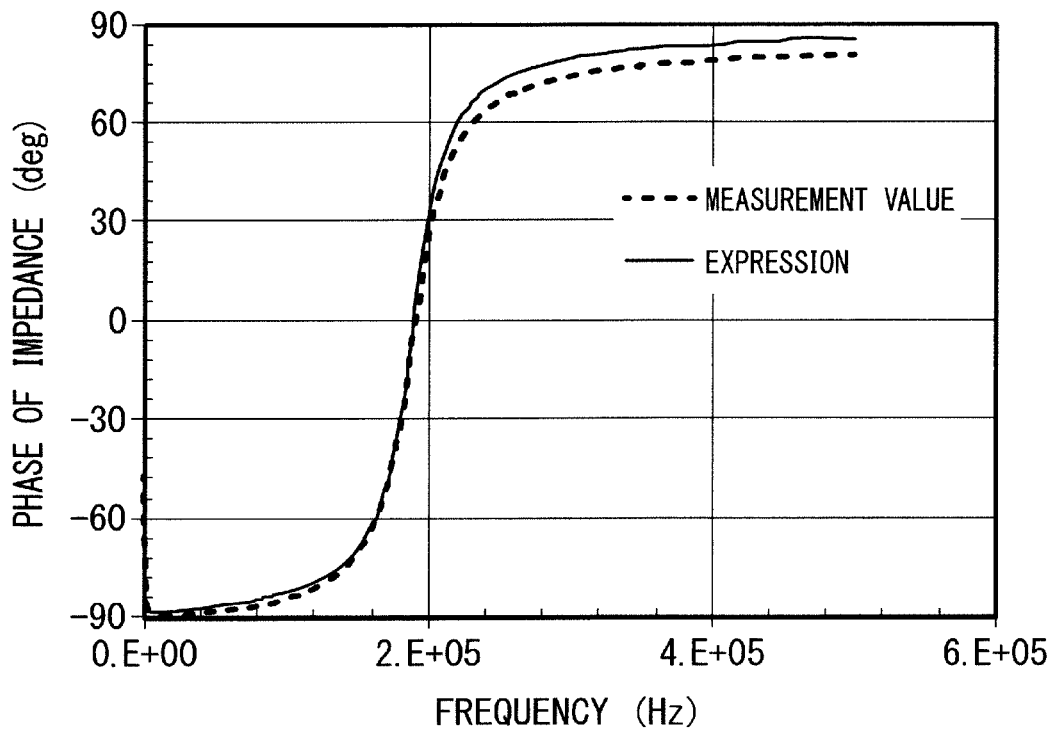
FIG. 13 A graph illustrating an example of frequency characteristics of the impedance.

FIGS. 12 and 13 illustrate respectively, similarly to FIGS. 7 and 8, regarding the one solar cell modules 12, the graph of measurement values of the impedance and the graph of the expression (3) in which the measurement values are assigned and the parameters are determined. The parameter values obtained here are as follows: $L_{mc}+L_{ms}$=5.2 µH, $R_{ms}$=1.1Ω, $R_{msh}$=11 kΩ, and $C_{md}$=0.14 µF.

At this point, while the value of a combined inductance $L_{mc}+L_{ms}$ is determined, the value of the inductance $L_{mc}$ and the value of the inductance $L_{ms}$ are still unknown Further, the value of the resistance $R_{mg}$ and the value of the capacity $C_{me}$ also are unknown.

In a state where, in the junction box 15, the switch 22a is OFF and the switch 22b is ON, the impedance measure 1 measures the frequency characteristic of the impedance of a circuit configured to return to the installation terminal 31 from the coupling cable 14L. The impedance obtained by the measurement is, in the equivalent circuit of FIG. 10, equivalent to the impedance between the terminal 30a and the installation terminal 31.

Here, the impedance $Z_{PV2}$ between the terminal 30a and the installation terminal 31 of the equivalent circuit in FIG. 10 is represented by the following expression (4).

[Expression 4]

$$Z_{PV2} = j \cdot 2\pi f \cdot L_{mc} + R_{mg} + \frac{1}{j \cdot 2\pi f C_{me}} \quad (4)$$

For example the analyzer 2 of a failure diagnostic device obtains unknown parameters ($L_{mc}$, $R_{mg}$, $C_{me}$) by assigning a plural sets of the impedance and a frequency measured by the impedance measure 1 in the impedance $Zp_{v2}$ and the frequency f of the expression (4) The parameter values obtained here are as follows: $L_{me}$=1.0 µH, $R_{mg}$=1.0 Q, and $C_{me}$=1.1 nF.

Above two measurements determines the value of the combined inductance $L_{mc}+L_{ms}$ and the value of the inductance $L_{mc}$, and the value of the inductance $L_{ms}$ is obtained. In the above example, the combined inductance $L_{ms}+L_{ms}$=5.2 µH and $L_{ms}$=4.2 µH are obtained, therefore, the inductance $L_{ms}$=1.0 µH (=5.2−4.2) is obtained. Accordingly, the parameter of the equivalent circuit of the solar cell module of FIG. 6. is determined.

Figure 14:
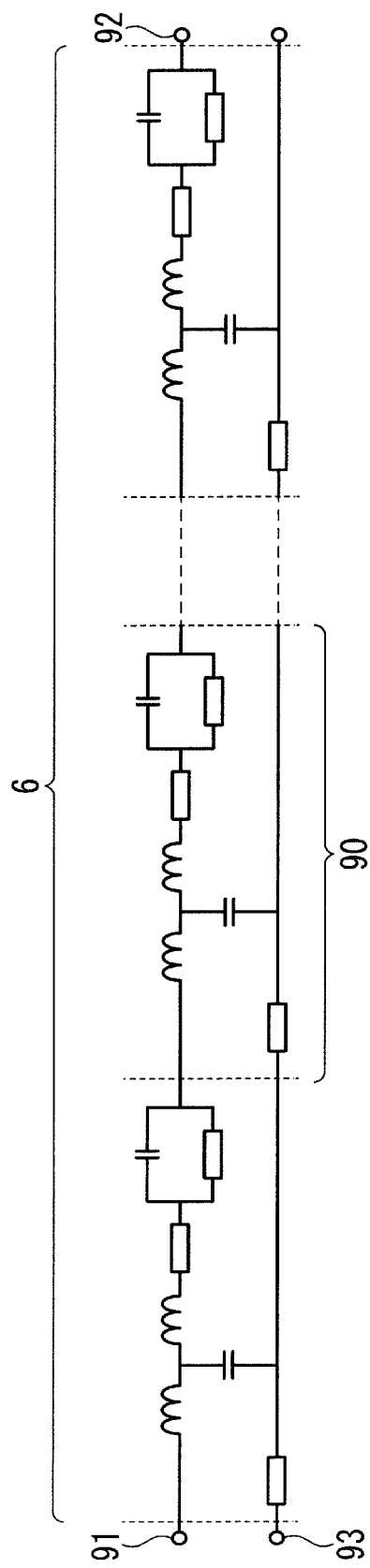
FIG. 14 A circuit diagram illustrating the equivalent circuit model of the solar cell string of the first embodiment.

FIG. 14 illustrates an equivalent circuit of the solar cell string configured by connecting N equivalent circuits 90, of which the parameters are determined, of the solar cell module of FIG. 6. A terminal 91 corresponds to the connector 26 of FIG. 1, a terminal 92 corresponds to the connector 27 of FIG. 1, and a terminal 93 corresponds to the connector 28 of FIG. 1. The failure diagnostic device obtains the inductance of the equivalent circuit of FIG. 4 that is obtained by modifying the equivalent circuit of FIG. 14 based on the parameters ($L_{me}$, $L_{ms}$, $R_{ms}$, $C_{md}$, $R_{msh}$, $C_{me}$, $R_{mg}$). And, the failure diagnostic device obtains an inductance that is one of the parameters of the equivalent circuit of FIG. 4 from the obtained inductance and the N equivalent circuits 90, and a graph like FIG. 9 is obtained based on a relationship between the number of solar cell modules and the obtained inductance.

Summary of First Embodiment

According to the failure diagnostic device of the solar cell string according to the present first embodiment, an inductance of the solar cell string is obtained and diagnosis of failure of the solar cell string is conducted based on the obtained inductance. According to the configuration, a high frequency signal is usable as the measurement signal, therefore, the diagnosis of failures of a large number of solar cell modules is ensured. Further, the failure diagnosis is conducted during nighttime, therefore, the decline in the power generation of the photovoltaic power generation of the whole photovoltaic power generation system is suppressed. Moreover, the insulation from the influence of deterioration of the sealing material enhances the precision of the failure diagnosis.

Further, according to the present first embodiment, the occurrence of disconnection and the disconnection part of the solar cell string is detected based on the obtained inductance and the inductance associated, in advance, with the number of the solar cell modules. Accordingly, the time and labor required for the failure diagnosis are lessened.

As described above, one of the end side output cables 13a and 13b which is the corresponding one end of output cables 13a and 13b is electrically connected to the measuring terminal of the impedance measure 1, and the frame 12d is electrically connected to the ground terminal of the impedance measure 1 via the inductor 24, thereby the failure diagnosis of the solar cell string 6 according to the present first embodiment is conducted. Accordingly, the other one of the end side output cables 13a and 13b which is the corresponding an other end of output cables 13a and 13b is not required to be connected to the ground terminal of the impedance measure 1, and the junction box 15 is not essential. However, according to the configuration in which the other one of the end side output cables 13a and 13b and the ground terminal of the impedance measure 1 are connected, a failure diagnosis of the solar cell string having a non-periodic configuration as in a second embodiment described hereunder. Further, according to the configuration including the junction box 15, wiring connection for the failure diagnosis is facilitated.

Second Embodiment

Figure 15:
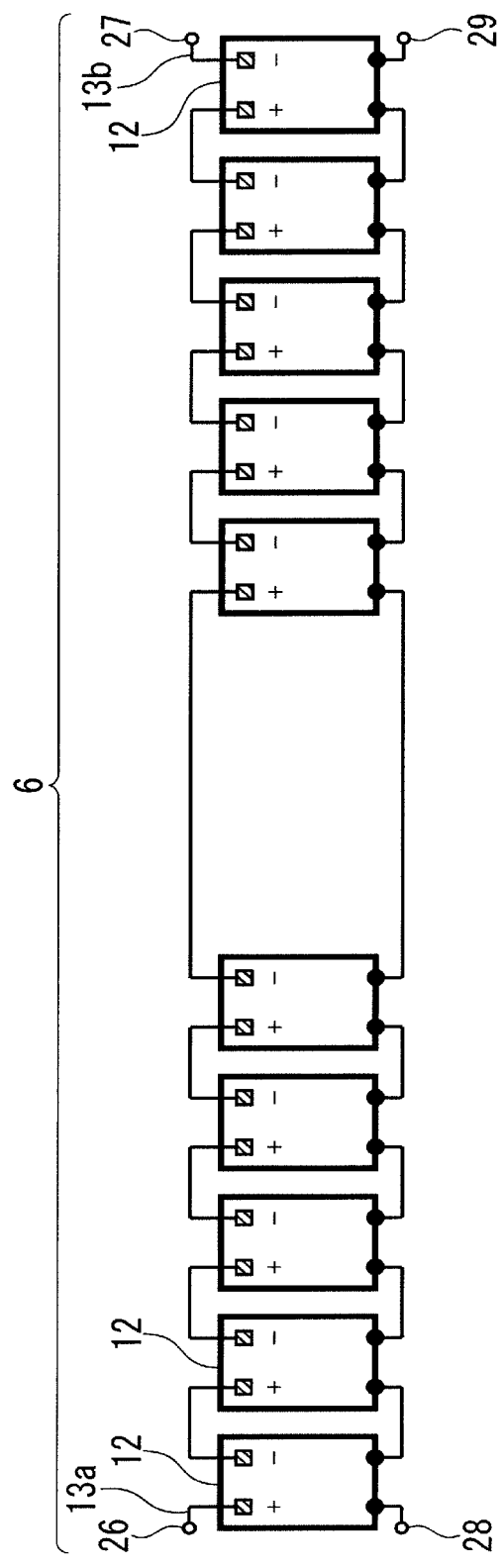
FIG. 15 A schematic configuration diagram illustrating a solar cell string according to a second embodiment.

FIG. 15 is a schematic configuration diagram illustrating a solar cell string diagnosed by the failure diagnostic device according to a second embodiment of the present invention. Hereunder, of the components to be described in the present embodiment, components that are the same or similar to those in the first embodiment are given correspondingly identical reference characters, and the description is mainly made on the rest of the components.

The target of the failure diagnosis of the failure diagnostic device according to the first embodiment is presumed that, as illustrated in FIG. 1, when the solar cell string 6 includes the plurality of solar cell modules 12 that are periodically arranged. However, as illustrated in FIG. 15, a case may be considered that, in the middle, a specific wiring which may be longer or shorter than the most of other wirings is interposed and the solar cell string 6 includes the plurality of solar cell modules 12 that are non-periodically arranged. In the failure diagnostic device according to the first embodiment, when the inductance of the specific wiring of the solar cell string 6 illustrated in FIG. 15 is unknown, a relationship between the number of solar cell modules N and the inductance $L_s$ is not determined, as a result, the failure diagnosis may not be conducted. Whereas, the failure diagnostic device according to the present second embodiment diagnoses failures of the solar cell string 6 in FIG. 15.

<Failure Diagnosis>

Figure 16:
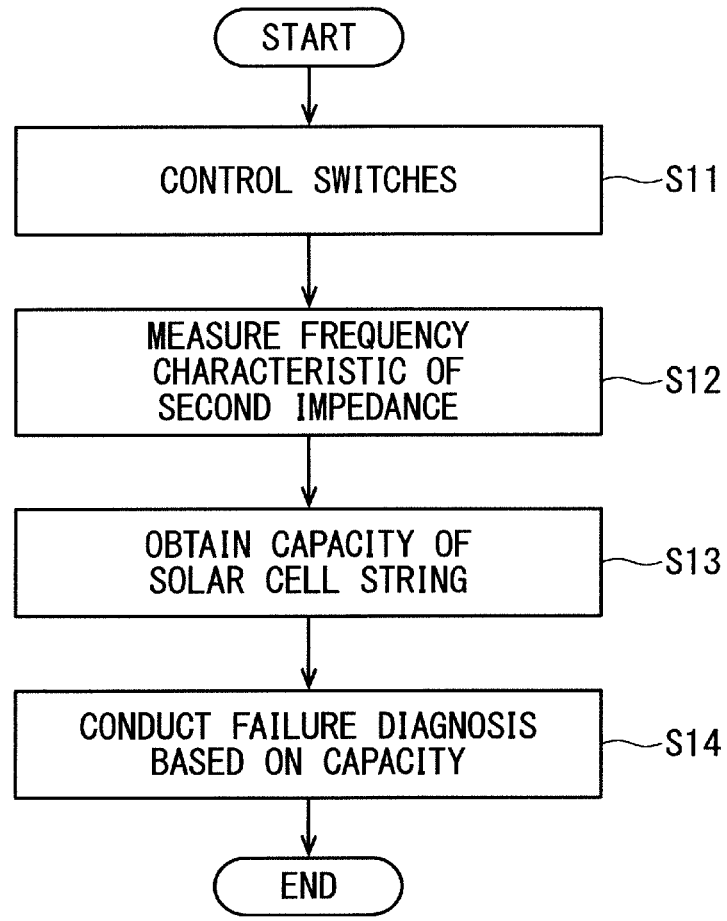
FIG. 16 A flowchart illustrating an operation of a failure diagnostic device according to the second embodiment.

FIG. 16 is a flowchart illustrating an operation of a failure diagnostic device according to the present first embodiment to conduct failure diagnosis for the solar cell string 6. In addition, the step S11 is assumed to perform during the time, such as nighttime, when the stop of the photovoltaic power generation system causes no trouble. Further, as a previous step of the step S11, connection of the connectors is established similarly to the previous step of FIG. 3 described in the first embodiment.

In the step S11, in the junction box 15, the switch 22b is OFF and the switch 22a is ON.

In the step S12, the impedance measure 1 measures frequency characteristic of the second impedance between the one of end side output cable 13a and the other of end side output cable 13b by employing a measurement method similar to the method of the first embodiment, for example.

In the step S13, the analyzer 2 obtains a capacity that is capacitance of the solar cell string 6 based on a relational expression containing an impedance, an inductance, the capacitance, and a frequency in a predetermined equivalent circuit of the solar cell string 6, and the frequency characteristic of the second impedance measured by the impedance measure 1.

Figure 17:
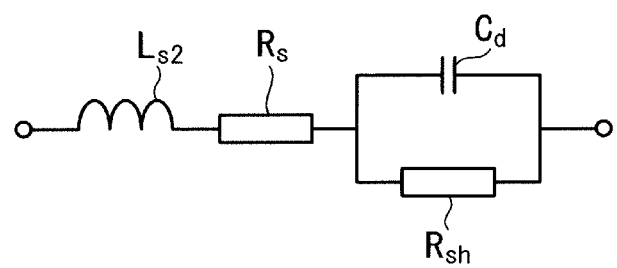
FIG. 17 A circuit diagram illustrating an equivalent circuit model of a solar cell string of the second embodiment.

FIG. 17 is a circuit diagram illustrating an equivalent circuit model of the solar cell string 6 of FIG. 15. The equivalent circuit of FIG. 17 is an equivalent circuit in which the solar cell string 6 in which the plurality of solar cell modules 12 are connected is simplified as one virtual solar cell module equivalent thereto. However, the both terminals of FIG. 17 are corresponding to the output cables 13a and 13b.

The number of the solar cell modules 12 configure the solar cell string 6 is represented as N, and, equivalent circuit constants of respective modules are assumed to be equal, the parameters ($L_{s2}$, $R_s$, $R_{sh}$, $C_d$) of each of the components of the equivalent circuit of FIG. 17 are represented by the following expressions (5) to (8) using the parameters ($L_{mc}$, $L_{ms}$, $R_{ms}$, $R_{msh}$, $C_{md}$) of FIG. 10.

[Expression 5]

$$L_{s2} = N \cdot (L_{mc} + L_{ms}) \quad (5)$$

[Expression 6]

$$R_s = N \cdot R_{ms} \quad (6)$$

[Expression 7]

$$R_{sh} = N \cdot R_{msh} \quad (7)$$

[Expression 8]

$$C_d = \frac{C_{md}}{N} \quad (8)$$

Further, the impedance $Z_{st2}$ between the both terminals of the equivalent circuit of FIG. 17 is represented by the following expression (9).

[Expression 9]

$$Z_{st2} = j \cdot 2\pi f \cdot L_{s2} + R_s + \frac{R_{sh}}{1 + j \cdot 2\pi f R_{sh} C_d} \quad (9)$$

Here, the physical unit of $C_d$ is the same as that of capacity $C_{md}$ as illustrated in expression (8). Therefore, the relational expression of expression (9) is a relational expression containing an impedance, an inductance, the capacitance, and a frequency in the predetermined equivalent circuit of the solar cell string 6.

The analyzer 2 obtains unknown parameters ($L_{s2}$, $R_s$, $R_{sh}$, $C_d$) by assigning a plural sets of the impedance and a frequency measured by the impedance measure 1 in the impedance $Z_{st2}$ and the frequency f of the expression (9). Accordingly, the capacity $C_d$ of the solar cell string 6 is obtained.

In the step S14, the determination unit 3 detects the occurrence of disconnection of the solar cell string 6 based on the capacity $C_d$ obtained by the analyzer 2. Generally, when the disconnection has occurred, the value of the capacity $C_d$ is to be the capacity of a disconnection part, therefore, the value of the capacity $C_d$ is to be much smaller than an expected value by the above expression (8). Accordingly, when the capacity $C_d$ obtained by the analyzer 2 is smaller than a predetermined threshold value, the determination unit 3 determines that the disconnection has occurred in the solar cell string 6. Here, when the disconnection has occurred in the wiring connection, the capacity $C_d$ is checked and the value is about 1 nF, accordingly, the value of 2 nF is applied as the predetermined threshold value.

Figure 18:
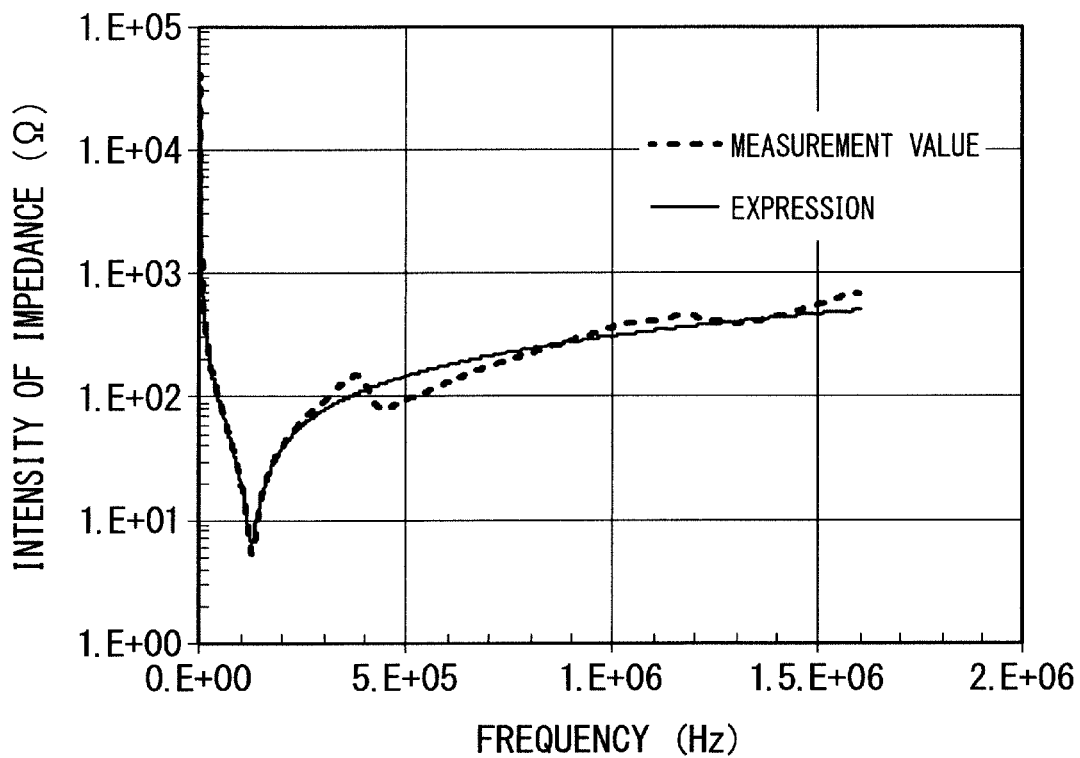
FIG. 18 A graph illustrating an example of frequency characteristics of a second impedance.
Figure 19:
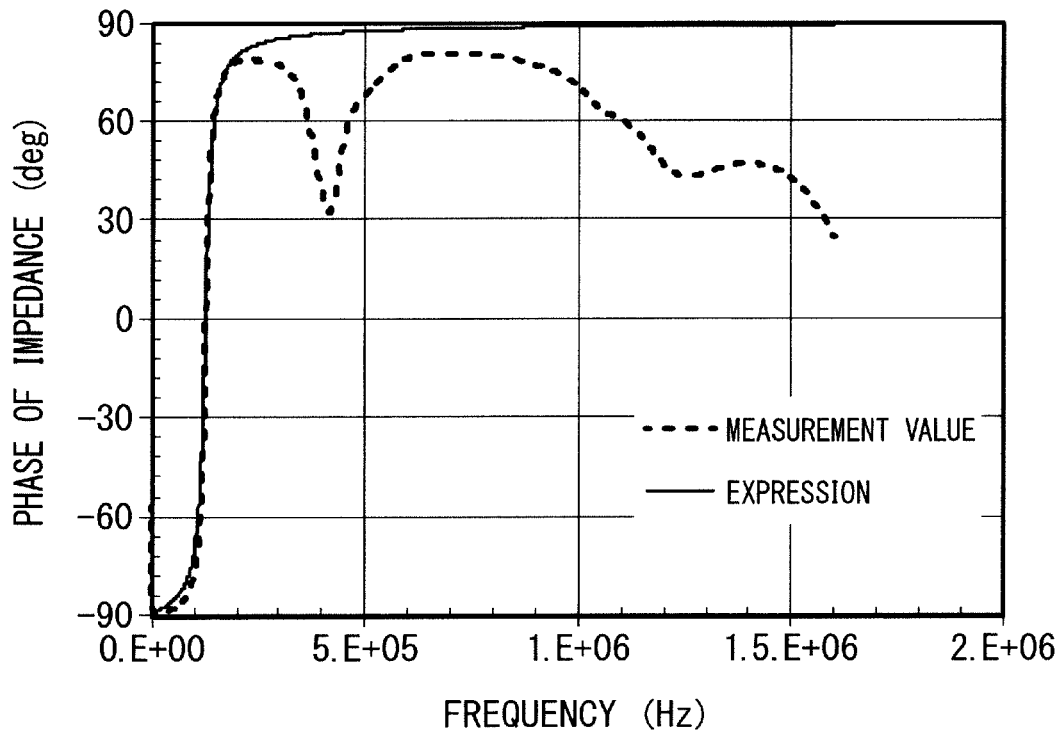
FIG. 19 A graph illustrating an example of frequency characteristics of the second impedance.
Figure 20:
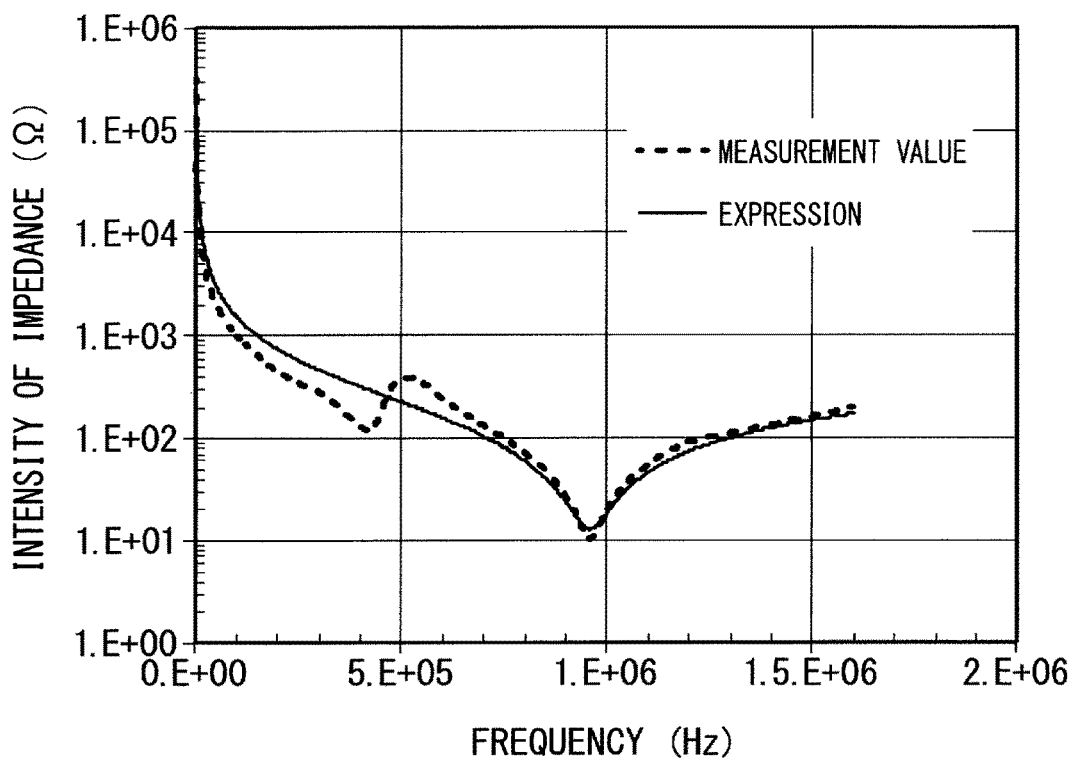
FIG. 20 A graph illustrating an example of frequency characteristics of the second impedance.
Figure 21:
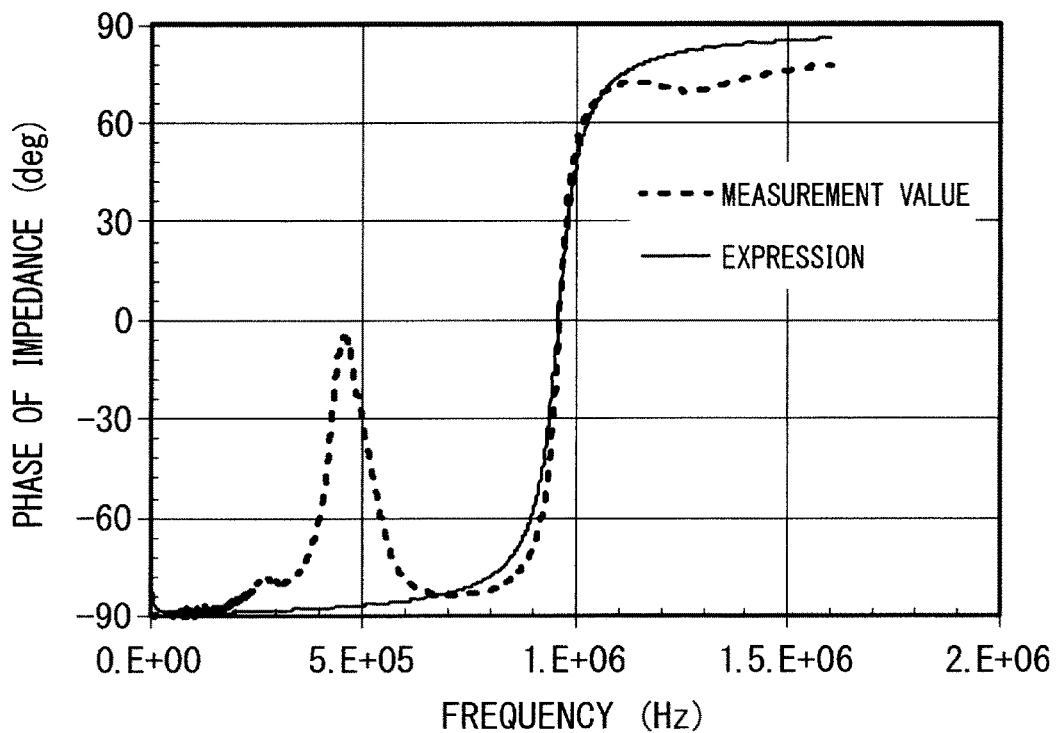
FIG. 21 A graph illustrating an example of frequency characteristics of the second impedance.

FIGS. 18, 19, 20, and 21 illustrate respectively, similarly to FIGS. 7 and 8, the graph of measurement values of the second impedance and the graph of the expression (9) in which the measurement values are assigned and the parameters are determined. FIGS. 18 and 19 are the graphs when the solar cell string 6 includes five solar cell modules 12 connected one another, in which the second module and the third module are connected with longer output cables, and, no disconnection has occurred in the longer output cables. Meanwhile, FIGS. 20 and 21 are the graphs when the solar cell string 6 includes the similar five solar cell modules 12, and, the disconnection has occurred in the longer output cables.

As illustrated in FIGS. 18 to 21, the graphs indicated by the expression (9) closely matches, at the resonance point on the low frequency side, with the graphs of the measurement values In the case of FIGS. 18 and 19, that is, when no disconnection has occurred, the obtained capacity $C_d$ is 32 nF. Meanwhile, in the case of FIGS. 20 and 21, that is, when the disconnection has occurred, the obtained capacity $C_d$ is 1 nF. Accordingly, the determination unit 3 configured as described above determines that, in the case of FIGS. 18 and 19 where the capacity $C_d$ is 2 nF or more, no disconnection has occurred, while, in the case of FIGS. 20 and 21 where the capacity $C_d$ is smaller than 2 nF, a disconnection has occurred.

Summary of Second Embodiment

According to the failure diagnostic device of the solar cell string according to the present second embodiment, a capacitance of the solar cell string is obtained and diagnosis of failure of the solar cell string is conducted based on the obtained capacitance. According to the configuration, the occurrence of disconnection is detected for the solar cell string 6 including the plurality of solar cell modules 12 that are non-periodically arranged due to the presence of a long wiring as illustrated in FIG. 15.

Additionally, the occurrence of disconnection by the diagnostic method described in the first embodiment may be determined after occurrence of disconnection by the diagnostic method described in the second embodiment is determined. For example, in the solar cell string 6 of FIG. 15, it is assumed that the occurrence of disconnection is determined in the wiring between the five solar cell modules 12 on the left side and the five solar cell modules 12 on the right side by the method described in the second embodiment. Subsequently, regarding the five solar cell modules 15 on the left side as a single unit, the impedance between the connectors 26 and 28 is measured from the positive electrode side, thereby presence of failure and a disconnection part in the five solar cell modules are determined. Thereafter, regarding the five solar cell modules 15 on the right side as a single unit, the impedance between the connectors 27 and 29 is measured from the negative electrode side, thereby occurrence of disconnection and a disconnection part in the five solar cell modules are determined.

Accordingly, when the whole of the plurality of solar cell modules 12 of the solar cell string 6 are non-periodically arranged, the occurrence of disconnection in the specific wiring having a different length from that of the most of other wirings is determined by employing the diagnostic method according to the present second embodiment. Thereafter, the plurality of solar cell modules 12 are segmented at the specific wiring, and the diagnostic method according to the first embodiment is performed for the segmented unit of the solar cell modules 12, thereby occurrence of disconnection and a disconnection part are determined.

The embodiments of the present invention can be combined, appropriately modified or omitted, without departing from the scope of the invention.

While the invention has been described in detail, the foregoing description is in all aspects illustrative and not restrictive. It is understood that numerous other modifications and variations can be devised without departing from the scope of the invention.

EXPLANATION OF REFERENCE SIGNS 1 impedance measure, 2 analyzer, 3 determination unit, 6 solar cell string, 12 solar cell module, 12a photovoltaic power generator, 12d frame, 13a, 13b output cable

The invention claimed is:

1. A failure diagnostic method of a solar cell string, wherein
the solar cell string includes a plurality of solar cell modules each having a photovoltaic power generator and an electro-conductive frame, a plurality of photovoltaic power generators of the plurality of solar cell modules being electrically connected in series by an output cable, a plurality of frames of the plurality of solar cell modules being electrically connected in common, the method comprising the steps of:
(a) measuring frequency characteristic of a first impedance between one end of the output cable electrically connecting the plurality of solar cell modules in series and the plurality of frames electrically connected in common by an impedance measurer;
(b) obtaining an inductance of the solar cell string based on a relational expression containing an impedance, an inductance, and a frequency in a predetermined equivalent circuit of the solar cell string and the frequency characteristic of the first impedance measured in the step (a); and
(c) conducting failure diagnosis for the solar cell string based on the inductance obtained in the step (b).

2. The failure diagnostic method of the solar cell string according to claim 1, wherein
the step of (c) includes a step of detecting occurrence of disconnection and a disconnection part of the solar cell string based on the inductance obtained in the step (b) and an inductance associated, in advance, with a number of the solar cell modules in which the photovoltaic power generators are electrically connected in series.

3. The failure diagnostic method of the solar cell string according to claim 1, comprising the steps of:
(d) measuring frequency characteristic of a second impedance between the one end and an other end of the output cable electrically connecting the plurality of solar cell modules in series by the impedance measurer;
(e) obtaining a capacitance of the solar cell string based on a relational expression containing an impedance, an inductance, a capacitance, and a frequency in a predetermined equivalent circuit of the solar cell string and the frequency characteristic of the second impedance measured in the step (d); and
(f) detecting the occurrence of disconnection of the solar cell string based on the capacitance obtained in the step (e).

4. The failure diagnostic device of the solar cell string according to claim 1, wherein
the step (a) is conducted during the time when the photovoltaic power generators are in a dark state.

5. A failure diagnostic device of solar cell string, wherein
the solar cell string includes a plurality of solar cell modules each having a photovoltaic power generator and an electro-conductive frame, a plurality of the photovoltaic power generators of the plurality of solar cell modules being electrically connected in series by an output cable, a plurality of the frames of the plurality of solar cell modules being electrically connected in common, the failure diagnostic device comprising:
an impedance measurer configured to measure frequency characteristic of a first impedance between one end of the output cable electrically connecting the plurality of solar cell modules in series and the plurality of frames electrically connected in common;
an analyzer configured to obtain an inductance of the solar cell string based on a relational expression containing an impedance, an inductance, and a frequency in a predetermined equivalent circuit of the solar cell string and the frequency characteristic of the first impedance measured by the impedance measurer; and
a determination processor configured to conduct failure diagnosis for the solar cell string based on the inductance obtained by the analyzer.

6. The failure diagnostic device of the solar cell string according to claim 5, wherein
the determination processor is configured to detect occurrence of disconnection and a disconnection part of the solar cell string based on the inductance obtained by the analyzer and an inductance associated, in advance, with a number of the solar cell modules in which the photovoltaic power generators are electrically connected in series.

7. The failure diagnostic device of the solar cell string according to claim 5, wherein the impedance measurer is configured to measure frequency characteristic of a second impedance between the one end and an other end of the output cable electrically connecting the plurality of solar cell modules in series, wherein the analyzer is configured to obtain a capacitance of the solar cell string based on a relational expression containing an impedance, an inductance, a capacitance, and a frequency in a predetermined equivalent circuit of the solar cell string and the frequency characteristic of the second impedance measured by the impedance measurer, and wherein the determination processor is configured to detect the occurrence of disconnection of the solar cell string based on the capacitance obtained by the analyzer.

* * * * *